(12) United States Patent
Togneri et al.

(10) Patent No.: US 9,148,138 B2
(45) Date of Patent: Sep. 29, 2015

(54) CONNECTION APPARATUS

(75) Inventors: Aldo Togneri, Roslin (GB); Marcus Daniel O'Sullivan, Adare (IE)

(73) Assignee: Analog Devices, Inc., Norwood, MA (US)

( * ) Notice: Subject to any disclaimer, the term of this patent is extended or adjusted under 35 U.S.C. 154(b) by 854 days.

(21) Appl. No.: 13/155,225

(22) Filed: Jun. 7, 2011

(65) Prior Publication Data
US 2012/0313687 A1 Dec. 13, 2012

(51) Int. Cl.
*H01H 17/14* (2006.01)
*H03K 17/082* (2006.01)
*H03K 17/12* (2006.01)

(52) U.S. Cl.
CPC .......... *H03K 17/0822* (2013.01); *H03K 17/122* (2013.01)

(58) Field of Classification Search
CPC ........ H03K 17/693; H04Q 3/00; H02J 7/0029
USPC .......................................... 307/115; 327/427
See application file for complete search history.

(56) References Cited

U.S. PATENT DOCUMENTS

| 6,404,173 | B1 * | 6/2002 | Telefus | 323/272 |
| 6,707,285 | B2 * | 3/2004 | Telefus et al. | 323/300 |
| 7,253,540 | B1 * | 8/2007 | Thalheim et al. | 307/115 |
| 2003/0117091 | A1 * | 6/2003 | Christian et al. | 315/387 |
| 2004/0195675 | A1 * | 10/2004 | Rossetti | 257/712 |
| 2006/0279965 | A1 * | 12/2006 | Nakamura | 363/16 |
| 2007/0205774 | A1 * | 9/2007 | Minich | 324/538 |
| 2010/0013542 | A1 * | 1/2010 | Kuroda | 327/427 |

* cited by examiner

*Primary Examiner* — Jared Fureman
*Assistant Examiner* — Alfonso Perez Borroto
(74) *Attorney, Agent, or Firm* — Schwegman Lundberg & Woessner, P.A.

(57) ABSTRACT

A connection apparatus for controlling the supply of electrical power to a load, the connection apparatus comprising first and second electrically controllable devices connected in parallel to each other and in series with the load; wherein the first and second electrically controllable devices are dissimilar, and where a safe operating area product of voltage, current and safe operating area time for the first device is greater than the product of voltage, current and the same safe operating area time for the second device, and an on state resistance for the second device is less than an on state resistance for the first device, and where a controller is provided to use the first device for a first period of time to power up the load, and thereafter the second device is used to maintain power to the load.

21 Claims, 4 Drawing Sheets

CONNECTION APPARATUS

FIELD OF THE INVENTION

The present invention relates to a connection apparatus for selectively making an electrical connection between a load and a power supply.

BACKGROUND OF THE INVENTION

There are instances when it is desired to connect an electrical load to a power supply that is already on. This can give rise to large inrush currents as capacitive components of the load charge up.

Such inrush currents can perturb the operation of the power supply, possibly causing protective measures within the power supply to trip. Furthermore the inrush currents may introduce perturbations in the power supplied to other loads connected to the power supply, and these perturbations may effect the operation of those circuits.

In order to address these issues it is known to provide "hot swap" circuits that regulate the current flow to a load that is newly introduced to a power supply.

SUMMARY OF THE INVENTION

According to a first aspect of the present invention there is provided a connection apparatus for controlling the supply of electrical power to a load, the connection apparatus comprising first and second electrically controllable devices connected in parallel, and in series with the load; wherein the first and second electrically controllable devices are dissimilar, and where a safe operating area product of voltage, current and safe operating area time for the first device is greater than the product of voltage, current and the same safe operating area time for the second device, and an on state resistance for the second device is less than an on state resistance for the first device, and where a controller is provided to use the first device for a first period of time to power up the load, and the second device thereafter to maintain power to the load.

It is thus possible to provide an improved "hot swap" arrangement in which one current control device is selected primarily on its ability to withstand the demands placed on it during a switch on period in which the current in the load and the voltage across the load are evolving, and generally the voltage across the load is building. The second current control device is selected for its properties to behave like a switch. That is to present a very low "on" resistance, thereby minimising the voltage dropped across the second electrically controllable device when it is on, and hence also giving rise to low power dissipation.

The controller may be a substantially conventional controller arranged to control the inrush currents to the load by controlling the current or the evolution of voltage across the load with respect to time, or by controlling the evolution of current through the load with respect to time or a combination of these approaches. The controller may operate in an open loop mode, but preferably operates within a closed feedback loop. The amount of current passed during inrush current control is selected by a designer such that the load is expected to be substantially fully powered up within the first period of time. The first period of time is a designer set parameter.

The controller may be adapted to provide a control signal to the second current control device when the load has been substantially powered up.

Alternatively a further drive circuit may be provided to monitor the output of the controller and to determine when the controller has finished controlling the inrush currents. This may for example be because the controller can no longer maintain a target current or a rate of current growth through the load, and this can be taken as being indicative of the load being fully powered. This may, for example, result in the drive signal to the first electrically controlled device exceeding a threshold value. This can be tested for, and used to generated a control signal for the second electrically controlled device.

Preferably the electrically controlled devices are semiconductor devices.

The first electrically controlled device needs to be operable to control or limit the current through it or the voltage across it. Transistors are suited for this mode of operation. Advantageously the first electrically controlled device is a field effect transistor.

The second electrically controlled device is used more like a switch. However some FETs exhibit very low $R_{DS}$ on, which is comparable with the resistance of some switches.

According to a second aspect of the present invention there is provided a load in association with the first and second current control devices for controlling the supply of current to the load, and wherein the first current control device is selected to have an enhanced safe operating region compared to the second current control device, and the second current control device is selected to have a lower on resistance than the first current control device, at least the first current control device having a control signal path for connection to a controller, said first and second current control devices being in parallel with each other, and in series with the load.

In some embodiments of the invention the second current control device may also be connected to the controller. Alternatively where the enhanced current carrying and lower on resistance provided by using two dissimilar transistors is to be applied in a backward compatible way to existing controllers that only have one control output for each load, then the further drive circuit may be used to control the second transistor. The further drive circuit may be provided as part of the load.

Thus the combination of the controller and the electrically controllable devices can be split. For example the controller and the semiconductor devices could be provided as a unit interposed between the power supply and the load. Alternatively the combination of controller and electrically controllable devices can be provided as part of a power supply or part of the load itself.

Furthermore the controller and the electrically controllable devices can be split from one another.

Thus it can be seen that the possible combinations are:
a) the controller is part of a power supply and the electrically controlled devices are:
  i. provided as an additional component
  ii. provided as part of the load
  iii. provided as part of the power supply.
b) The controller is a separate component and the electrically controlled devices are:
  i. provided as part of the power supply
  ii. provided as part of the load
  iii. provided as a further module.
c) The controller is part of the load and the electrically controlled devices are:
  i. provided as part of the power supply
  ii. provided as an additional components/unit or module;
  iii. provided as part of the load.

The configuration chosen may vary depending on connector availability and backward compatibility requirements with pre-existing power supplies and boards.

BRIEF DESCRIPTION OF THE FIGURES

The present invention will now be described, by way of non-limiting example only, with reference to the accompanying Figures, in which.

DESCRIPTION OF EXEMPLARY EMBODIMENTS OF THE INVENTION

Figure 1:
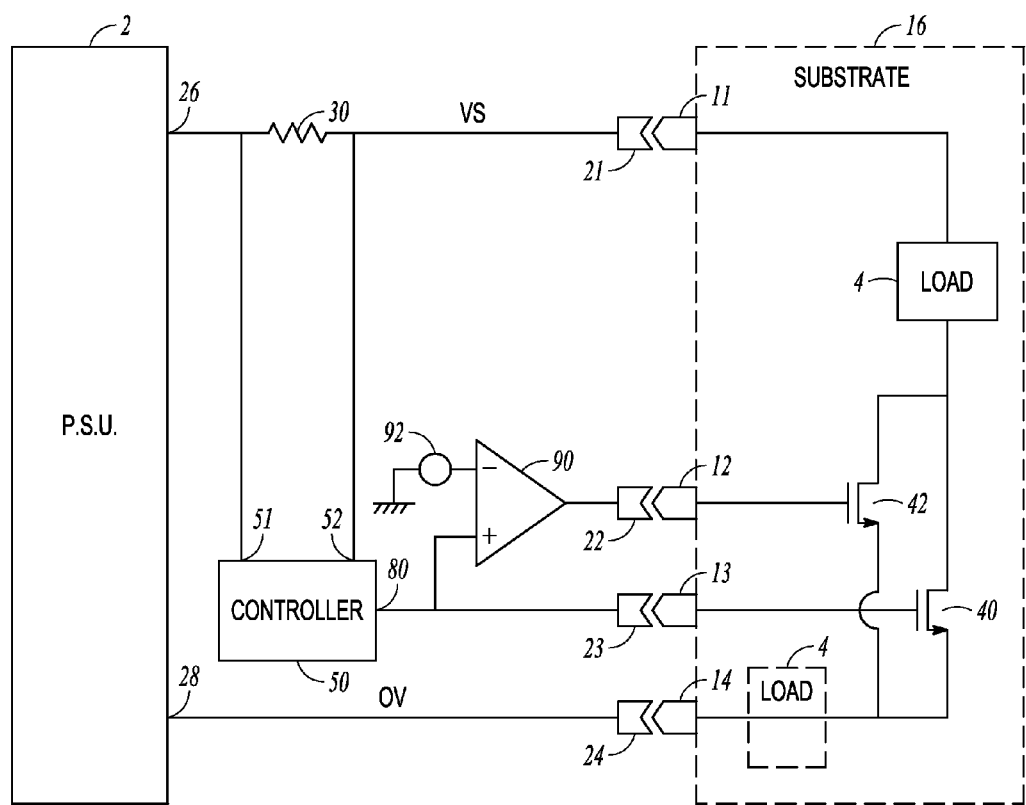
FIG. 1 is a schematic diagram of a hot swap circuit constituting an embodiment of the present invention.

FIG. 1 schematically illustrates a connection apparatus for controlling inrush currents from a power supply 2 to a load 4 when the load is introduced to the power supply 2 and the power supply 2 is already on and has established its output voltage.

The power supply 2 may, for example, be serving several other loads which may share a common supply line. Examples of such loads might include computer servers in a rack mounted array or other hot swappable circuit boards. However, on smaller scales the present invention can be applied to any device that is likely to be introduced to an established power supply, such as universal serial bus devices.

The load 4 can be electrically connected to and disconnected from the power supply 2 by way of a plurality of plugs 11, 12, 13 and 14 cooperating with respective sockets 21, 22, 23 and 24.

In the arrangement shown in FIG. 1, plug 11 cooperates with socket 21 to establish a connection between a first output 26, such as a positive voltage output Vs, and the load. Similarly the plug 14 and socket 24 serves to establish a return connection for current from the load 4 to a second output 28, such as a 0 V terminal, of the power supply 2.

A current sensing resistor 30 is optionally provided in one of the supply rails between the power supply and the load 4. In this example, it is placed in the positive supply rail.

In order to control inrush currents when the load is connected, and also to allow the load to be de-powered if a fault develops on it, first and second electrically controlled current control devices 40 and 42 are provided in parallel with one another, but in series with the load 4.

In the example shown in FIG. 1, current control devices 40 and 42 are arranged as "low side" switches for the load 4. This is merely an implementation choice and the current control devices can also be arranged as high side switches by positioning the load 4 between the current control devices 40 and 42 and connector 14 as shown by the dashed lined box in FIG. 1.

Figure 4:
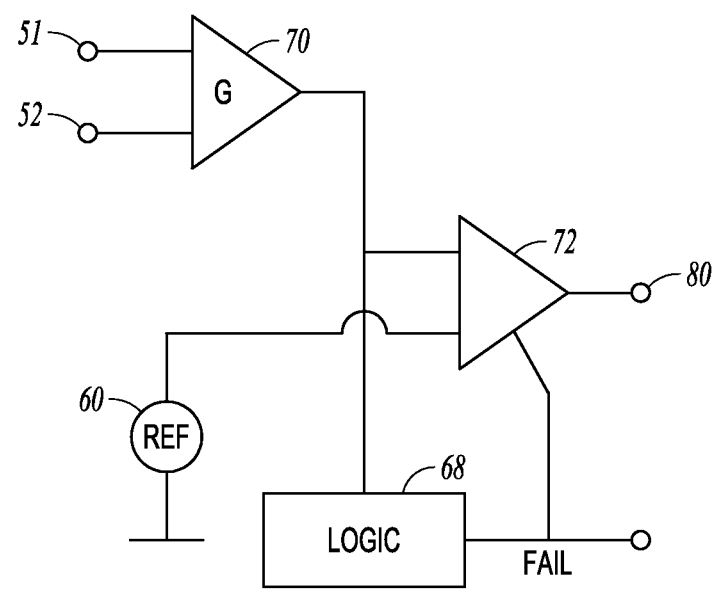
FIG. 4 schematically illustrates the components within a controller.

The current control devices 40 and 42 are advantageously transistors, and field effect transistors are particularly suitable for this role. The field effect transistors 40 and 42 could each be used as a switch, however in the arrangement shown in FIG. 1 their roles are significantly different. The first transistor 40 is directly connected to an output of a controller 50. The function of the controller 50 is, upon detecting that the load has been introduced to the power supply and that the current has started to flow, to control the inrush currents to the load so as not to perturb the power supply. Such controllers are already known and, in the embodiment shown in FIG. 1 the controller 50 can be entirely conventional. Thus the controller has a first input 51 connected to a first side of the sensing resistor 30 and a second input 52 connected to a second side of the sensing resistor 30. The controller has knowledge of the size of the resistor 30 and, by monitoring the voltage across it, can determine the magnitude of the current being supplied to the load. Typically and as shown in FIG. 4, the controller includes a reference generator 60 that sets a target inrush current. An amplifier 70 having a gain G is connected to the first and second inputs 51 and 52 and provides an output to a first input of an error amplifier 72, and optionally also to logic 68 such that the logic can determine when the output of the amplifier 70 becomes non-zero, thereby indicating that current flow has occurred to a load. This may be beneficial if it is desired to provide additional functionality, such as providing a maximum period in which an attempt will be made to power up a board before determining it as faulty and invoking protection means in the controller to remove the drive from the transistor 40 and to inhibit transistor 42 from operating. The logic 68 may assert a "FAIL" signal after a suitable time out period. This may be provided to the error amplifier 72 to disable its output. A second input of the error amplifier 72 receives the output of the reference generator 60. The error amplifier 72 compares the target current flow to the load, as defined by the reference generator 60, with the actual current flow 70 to produce an error signal which can then be used to drive the first transistor 40. Because the transistor 40 controls the current through the load, a simple feed back arrangement is formed. The error amplifier 72 could be replaced with a more sophisticated controller such as a proportional, integral, differential controller as is known to the person skilled in the art. Also, if desired the reference generator could be modified to provide a reference signal that evolves during the power up sequence rather than being a constant value, for example to match the safe operating area characteristics of the first transistor 40.

In effect the current sensing resistor 30, controller 50, and transistor 40 form a conventional inrush current control device suitable for use with a hot swappable load. The problem with this conventional arrangement is that the transistor 40 needs to be selected so as to be able to withstand the thermal stresses placed upon it during the inrush current control, and also then needs to achieve a low on resistance such that the power dissipation of the hot swap components in series with the load remains as low as reasonably possible. The inventors realised that this an unrealistic expectation and that a second transistor should be provided with the characteristics of the second transistor selected specifically for its low on resistance such that it is used to maintain power to the load once the first transistor 40 has completed control of inrush currents.

In order to achieve this, a comparator 90 is arranged to monitor the output of the controller 80 and to decide when the load has become fully powered. By inspection of FIG. 1 in conjunction with FIG. 4, it can be observed that controller 50 can maintain closed loop control of the load current whilst the load is not fully powered. However once the load has become fully connected to the power supply unit 2, i.e. the voltage across the transistor 40 has fallen to substantially zero, then the transistor can no longer control the current in the load. However assuming that final (fully powered) load current is less than the current level demanded by the inrush current control system, then the amplifier 72 will have a large difference at its inputs and hence the error signal 80 at the output of the controller will grow large in a direction corresponding to turning the transistor further on. The comparator 90 receives the error signal and compares this with a threshold voltage formed by a voltage generator 92. When the error signal exceeds the threshold voltage then it can be assumed that the load is fully connected and the comparator 90 outputs a control signal to the gate of the transistor 42 to switch it on. Thus, once the load has become fully powered both the transistors 40 and 42 are on in parallel.

It should be noted that although the comparator 90 and the voltage reference 92 have been drawn as being external to the controller 50, these components could if desired be provided internal to the controller 50. Similarly, they could if desired be provided as part of the load or at least in parallel with the load and hence although two transistors 40 and 42 are used to control the current through the load, only one connection is actually needed between the controller 50 and the substrate 16 carrying the load.

Figure 2:
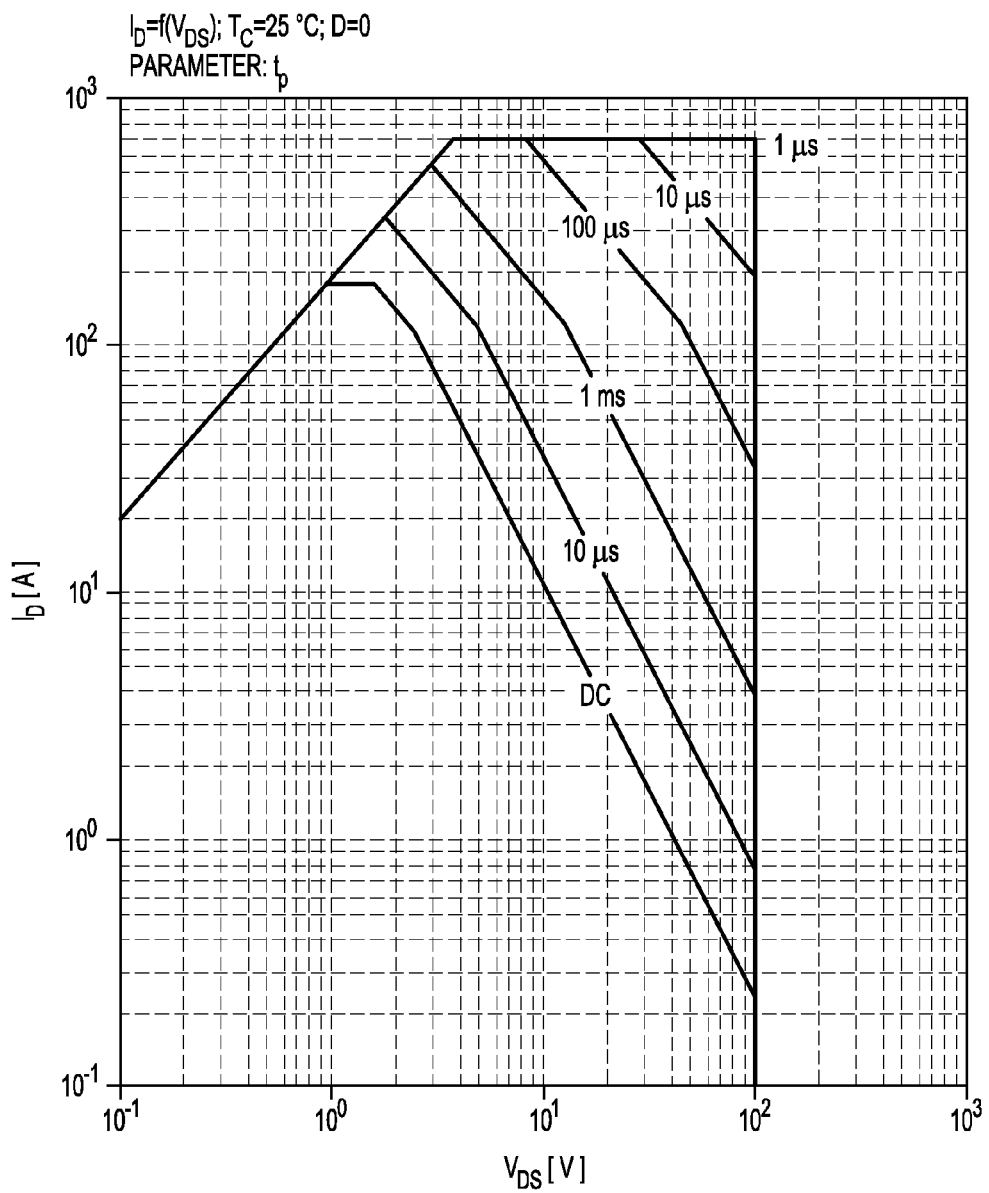
FIG. 2 is a safe operating area graph for a transistor suitable for use as the first electrically controllable device.
Figure 3:
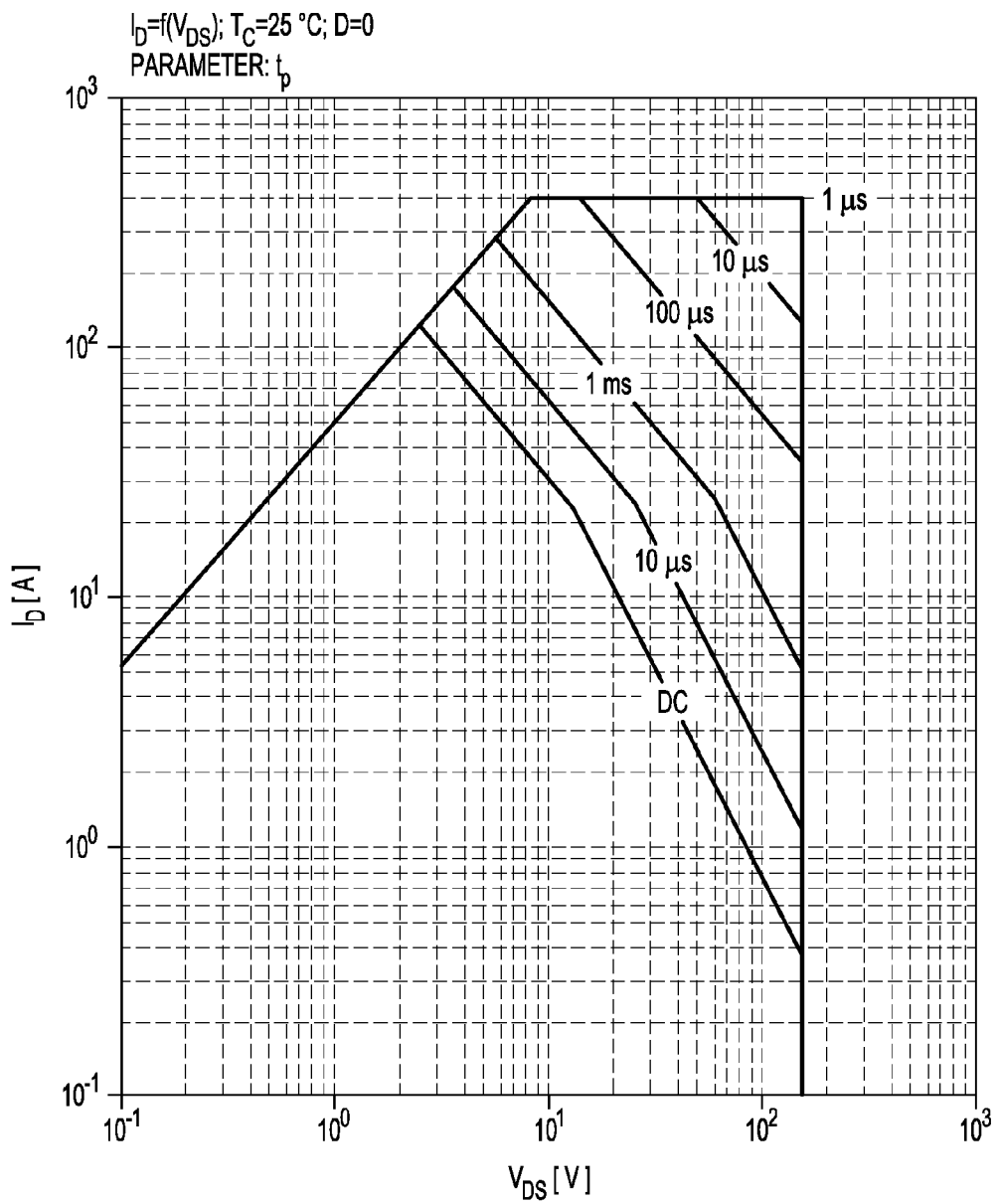
FIG. 3 is a safe operating area graph for a transistor suitable for use as the second electrically controllable device.

The transistors have several operating characteristics that define their operational parameters. One such characteristic which is normally published by the transistor manufacturer is its safe operating area. Examples of the safe operating area characteristics are shown in FIGS. 2 and 3. FIG. 2 is the safe operating characteristic for a transistor available as IPB025N10N3 G from Infineon. FIG. 3 is the operating characteristic for a transistor available as IPB072N15N3 G also available from Infineon.

The IPB025N10N3 device has, according to its data sheet, maximum value of $R_{DS}$ on of 2.5 mΩ. Its also rated to handle drain source voltages of up to 100 volts and drain currents of up to 180 amps. However if one looks more carefully at FIG. 2 it can be seen that the maximum current performance depends on the drain source voltage and how long the transistor is expected to pass that current. Thus, if for example the drain source voltage of the transistor is 20 volts then the transistor can continuously pass a current of between 3 and 4 amps. However if the transistor only needs to be passing current for 10 ms then the safe operating curve shows that the transistor can now safely pass a current of a little over 10 amps. If however the device only needs to be on for 1 ms then for the same drain source voltage of 20 volts the transistor can now safely pass a current of around 60 amps. Similarly if the transistor only needs to be on for around 100 microseconds in a safe operating characteristic shows that it can pass a current of substantially 300 amps for that duration.

Moving on to FIG. 3, the IPB072N15N3 G device if operated 20 volts can continuously pass a current of 10 amps. This is higher than the current shown for the device of FIG. 2. Similarly if it only needs to be operated for 10 ms this device can pass a current of 30 amps compared to the 20 amps of the other device. These differences continue and can be observed that product of drain source voltage by drain current by time is generally larger for the IPB072N15N3 device of voltages in excess of a few volts than the similar product the IPB025N10N3 device. However the device whose operating characteristic is shown in FIG. 3 has an $R_{DS}$ on value of 7.2 mΩ which is nearly 3 times greater than that of the IPB025N10N3 device. It therefore follows that the IPB025N10N3 device is more suitable for use as an on-off switch, i.e. the transistor 42 of FIG. 1, whereas the IPB072N15N3 device is more suitable for use in controlling the current during the current inrush control phase. It should be appreciated that there are many hundreds of transistors available from different manufacturers and these devices are only given by way of a specific example in order to exemplify the present invention and the invention is in no way limited to use of just these two devices.

In other embodiments the current control transistor 40 could be driven with a control signal, which is either a constant value in an open loop system or controlled via a feedback system as described hereinbefore, and the switching transistor 42 can be actuated after the first period has expired.

This patent application has been drafted for initial submission to the United States Patent and Trade Mark Office and consequently the claims have been presented in single dependency format. However other jurisdictions allow the use of multiple dependencies and it is to be assumed that at least for the purposes of initially filing patent applications in those other jurisdictions that each claim can be dependent on any preceding claim where those claims refer back to a single independent claim, unless such a combination is clearly technically unfeasible.

The invention claimed is:

1. A connection apparatus for applying an established supply of electrical power to a load, the connection apparatus comprising first and second electrically controllable devices connected in parallel to each other and in series with the load; wherein the first and second electrically controllable devices are dissimilar, wherein the first electronically controllable device has a greater operating characteristic rating, defined by a product of drain source voltage and drain current for a specified on state operating time, than an operating characteristic rating of the second electronically controllable device, and an on state resistance for the second electronically controllable device is less than an on state resistance for the first electronically controllable device, and wherein a controller is provided to use the first electronically controllable device for a first period of time that the established supply of power is applied to the load, and thereafter the second electronically controllable device is used to maintain power to the load.

2. A connection apparatus as claimed in claim 1, in which the first and second electrically controllable devices are transistors.

3. A connection apparatus as claimed in claim 2, in which the first and second electrically controllable devices are field effect transistors.

4. A connection apparatus as claimed in claim 1, in which the controller is arranged to control the current passed by the first electrically controllable device such that the voltage across the load builds toward the supply voltage provided by a power supply connected to supply power to the load within the first period.

5. A connection apparatus as claimed in claim 4, in which once the voltage across the load has reached that of the supply voltage the second electrically controllable device is switched on.

6. A connection apparatus as claimed in claim 5, in which when the second electrically controllable device is on the first electrically controllable device is also on.

7. A connection apparatus as claimed in claim 1, in which the controller provides a drive signal to control current flow to the load via the first electrically controllable device, and is further adapted to provide a control signal to the second electrically controllable device.

8. A connection apparatus as claimed in claim 1, in which the controller provides a variable drive signal to control current flow to the load via the first electrically controllable device, and a further drive circuit is arranged to monitor the variable drive signal and to output a control signal to the second electrically controlled device once the variable drive signal attains a value indicative of the load having completed power up.

9. A connection apparatus as claimed in claim 1, in which the controller provides a constant current flow control signal to the first electrically controllable device, and once the first period has expired or the current flow has reduced thereby indicating that the load is powered up, the second electrically controllable device is activated.

10. A load in association with first and second current control devices for controlling application of an established supply of current to the load, and wherein the first current control device is selected to have a greater rated maximum operating region, defined by a product of drain source voltage and drain current for a specified operating on state time, compared to a rated maximum operating region of the second current control device, and the second current control device is selected to have a lower on resistance than the first current control device, at least the first current control device having a control signal path for connection to a controller, and the first and second current control devices are in parallel with each other, and in series with the load, wherein the first current control device is used for a first period of time that the established supply of current is applied to the load, and thereafter the second electronically controllable device is used to control current to the load.

11. A load as claimed in claim 10, in which the second current control device has a respective control signal path for connection to a controller.

12. A load as claimed in claim 10, in which the load and the first and second current control devices are carried on a shared substrate.

13. A load as claimed in claim 12, in which the substrate has connectors for engaging and disengaging with matching connectors of a power supply.

14. A load as claimed in claim 10, in which the first and second current control devices are field effect transistors.

15. A load as claimed in claim 10, in which the first and second current control devices are arranged as high side switches in relation to the load.

16. A load as claimed in claim 10, in which the first and second current control devices are arranged as low side switches in relation to the load.

17. A controller for use with a load as claimed in claim 10, wherein the controller is arranged to supply a signal to the first current control device so as to control inrush currents to the load during a first phase, and subsequently to use the second current control device to provide reduced impedance connection from a power supply to the load.

18. A controller as claimed in claim 17, in which the first current control device remains conducting after the first phase.

19. A controller as claimed in claim 17, in which the controller is arranged to control the evolution of voltage across the load with respect to time.

20. A controller as claimed in claim 17, in which the controller is arranged to control the evolution of current through the load with respect to time.

21. A method of applying an established supply of electrical power to a load, in which during a first phase that the established supply of electrical power is applied to the load a first semiconductor device is used to limit inrush currents to the load, and subsequently a second semiconductor device having a lower on resistance and lower rated maximum operating region, defined by a product of drain source voltage and drain current for a specified operating on state time, is used to maintain a current flow connection to the load.

* * * * *